United States Patent
Zhang et al.

(10) Patent No.: US 11,270,628 B2
(45) Date of Patent: Mar. 8, 2022

(54) DISPLAY PANEL, DISPLAY ASSEMBLY, DISPLAY APPARATUS AND DRIVE METHOD THEREFOR

(71) Applicants: BEIJING BOE DISPLAY TECHNOLOGY CO., LTD., Beijing (CN); BOE TECHNOLOGY GROUP CO., LTD., Beijing (CN)

(72) Inventors: Huabing Zhang, Beijing (CN); Zhichao Lv, Beijing (CN); Qiang Zhang, Beijing (CN); Weipin Hu, Beijing (CN); Chenyang Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/620,724

(22) PCT Filed: Jan. 7, 2019

(86) PCT No.: PCT/CN2019/070587
§ 371 (c)(1),
(2) Date: Dec. 9, 2019

(87) PCT Pub. No.: WO2019/179217
PCT Pub. Date: Sep. 26, 2019

(65) Prior Publication Data
US 2020/0160775 A1  May 21, 2020

(30) Foreign Application Priority Data
Mar. 20, 2018  (CN) .......................... 201810230163.7

(51) Int. Cl.
*G09G 3/30* (2006.01)
*G09G 3/20* (2006.01)
(Continued)

(52) U.S. Cl.
CPC ........... *G09G 3/30* (2013.01); *G02F 1/13306* (2013.01); *G09G 3/2003* (2013.01);
(Continued)

(58) Field of Classification Search
CPC ................. G09G 3/30; G09G 2300/46; G09G 2300/0456; G02F 1/1397
See application file for complete search history.

(56) References Cited

U.S. PATENT DOCUMENTS 7,102,704 B2 * 9/2006 Mitsui ............... G02F 1/133621
349/62
8,867,015 B2 * 10/2014 Posner ................... G02F 1/1333
349/193
(Continued)

FOREIGN PATENT DOCUMENTS

CN  102646696 A  8/2012
CN  103531100 A  1/2014
(Continued)

OTHER PUBLICATIONS

International Search Report and Written Opinion issued in corresponding International Application No. PCT/CN2019/070587, dated Mar. 27, 2019, with English language translation.
(Continued)

*Primary Examiner* — Kevin M Nguyen
(74) *Attorney, Agent, or Firm* — McDermott Will & Emery LLP

(57) ABSTRACT

A display panel, a display assembly, a display apparatus and a drive method therefor are disclosed. The display panel includes a first display area and at least one second display
(Continued)

area. The first display area includes first sub-pixels, and the first sub-pixels are non-transparent sub-pixels. The at least one second display area includes second sub-pixels, and the second sub-pixels are transparent sub-pixels.

15 Claims, 7 Drawing Sheets

(51) Int. Cl.
*G02F 1/133* (2006.01)
*H01L 27/32* (2006.01)
*H01L 51/52* (2006.01)

(52) U.S. Cl.
CPC ...... *H01L 27/3232* (2013.01); *H01L 27/3234* (2013.01); *H01L 27/3267* (2013.01); *H01L 51/5218* (2013.01); *H01L 51/5234* (2013.01); *G02F 2201/44* (2013.01); *G09G 2320/0666* (2013.01); *G09G 2320/0686* (2013.01); *H01L 2251/5315* (2013.01)

(56) References Cited

U.S. PATENT DOCUMENTS

| | | | |
|---|---|---|---|
| 10,986,255 B2* | 4/2021 | Evans, V | G06F 1/1637 |
| 2008/0137008 A1* | 6/2008 | Rogojevic | H01L 25/048 349/69 |
| 2013/0135328 A1 | 5/2013 | Rappoport et al. | |
| 2014/0009720 A1 | 1/2014 | Huang | |
| 2014/0055718 A1 | 2/2014 | Li | |
| 2017/0212398 A1 | 7/2017 | Cao et al. | |
| 2018/0031932 A1* | 2/2018 | Koide | G02F 1/133345 |
| 2018/0260079 A1 | 9/2018 | Zhang | |
| 2019/0081123 A1 | 3/2019 | Wu et al. | |

FOREIGN PATENT DOCUMENTS

| | | |
|---|---|---|
| CN | 104965338 A | 10/2015 |
| CN | 106878564 A | 6/2017 |
| CN | 107068724 A | 8/2017 |
| CN | 108254963 A | 7/2018 |

OTHER PUBLICATIONS

First Office Action issued in corresponding Chinese Application No. 201810230163.7 dated Feb. 6, 2020, with English language translation.

* cited by examiner

DISPLAY PANEL, DISPLAY ASSEMBLY, DISPLAY APPARATUS AND DRIVE METHOD THEREFOR

CROSS-REFERENCE TO RELATED APPLICATIONS

This application is a national phase entry under 35 USC 371 of International Patent Application No. PCT/CN2019/070587 filed on Jan. 7, 2019, which claims priority to Chinese Patent Application No. 201810230163.7, filed with the Chinese Patent Office on Mar. 20, 2018, titled "DISPLAY PANEL, DISPLAY ASSEMBLY, DISPLAY APPARATUS AND DRIVE METHOD THEREFOR", which are incorporated herein by reference in their entirety.

TECHNICAL FIELD

The present disclosure relates to the field of display technologies, and in particular, to a display panel, a display assembly, a display apparatus and a drive method therefor.

BACKGROUND

In structural design of display devices (such as mobile phones, tablet computers, wearable display products and other terminal products), screen-to-body ratio, i.e., a ratio of a display area of a display device to an entire front surface of the display device, is an important design parameter.

With the development of display technologies, display devices are increasingly developing toward a direction of super large screen-to-body ratio, even full-screen display (that is, an area of the display area is equal to or very close to an area of the entire front surface of the display device). Therefore, how to increase the screen-to-body ratio of the display device has become a hot topic of research for those skilled in the art.

To ensure normal operation of devices such as a front camera unit, a light sensor, a distance sensor, or a biosensor in the display device, the devices need to be configured to face a front side of the display device. For example, a lens of the front camera unit need to be configured to face the front side of the display device, and a sensing surface of a sensor need to be configured to face the front side of the display device. In this way, the devices can collect information in the environment and then perform corresponding operations, for example, collecting an image of a person or an object at the front side of the display device, or collecting light at the front side of the display device.

SUMMARY

A first aspect of embodiments of the present disclosure provides a display panel, which includes a first display area and at least one second display area. The first display area includes first sub-pixels, and the first sub-pixels are non-transparent sub-pixels. The at least one second display area includes second sub-pixels, and the second sub-pixels are transparent sub-pixels.

In some embodiments of the present disclosure, at least one first sub-pixel includes a reflective electrode layer, a first electroluminescent layer, and a first transmissive electrode layer that are disposed in a stack. The reflective electrode layer is disposed closer to a back side of the display panel than the first electroluminescent layer, and is configured to reflect light emitted by the first electroluminescent layer In some embodiments of the present disclosure, each first sub-pixel includes a reflective layer, a first transmissive electrode layer, a first electroluminescent layer, and a fourth transmissive electrode layer that are disposed in a stack. The reflective layer is disposed closer to a back side of the display panel than the first transmissive electrode layer, and is configured to reflect light emitted by the first electroluminescent layer.

In some embodiments of the present disclosure, the second sub-pixel includes a second transmissive electrode layer, a second electroluminescent layer, and a third transmissive electrode layer that are disposed in a stack.

In some embodiments of the present disclosure, the first sub-pixel includes the first electroluminescent layer, and the first electroluminescent layer is coupled to the second electroluminescent layer; or, the first electroluminescent layer is separated from the second electroluminescent layer.

In some embodiments of the present disclosure, the first sub-pixel includes the first transmissive electrode layer, and the first transmissive electrode layer is coupled to the third transmissive electrode layer; or, the first transmissive electrode layer is separated from the third transmissive electrode layer.

In some embodiments of the present disclosure, the first sub-pixel includes the fourth transmissive electrode layer, and the fourth transmissive electrode layer is coupled to the third transmissive electrode layer; or, the fourth transmissive electrode layer is separated from the third transmissive electrode layer.

In some embodiments of the present disclosure, an area of the first display area is greater than an area of the second display area(s).

In some embodiments of the present disclosure, the second display area(s) are disposed at an edge of the display panel; the second display area(s) are disposed around the first display area; or, the first display area is disposed around the second display area(s).

A second aspect of embodiments of the present disclosure provides a display assembly. The display assembly includes the display panel provided in any one of the above embodiments, and a light valve disposed on a back side of the display panel. Border(s) of orthographic projection(s) of the second display area(s) on the back side are located within a border of an orthographic projection of the light valve on the back side. The light valve is configured to allow or block light directed to the back side of the display panel to pass through the light valve.

In some embodiments of the present disclosure, the light valve includes a first polarizer and a second polarizer with mutually perpendicular polarization directions, and a liquid crystal cell. The first polarizer and the second polarizer are disposed on two opposite surfaces of the liquid crystal cell. The liquid crystal cell includes a liquid crystal layer, a first alignment film and a second alignment film that are disposed on opposite sides of the liquid crystal layer, and a first electrode and a second electrode that are used for driving liquid crystal molecules in the liquid crystal layer to rotate.

In some embodiments of the present disclosure, the first electrode is disposed between the first alignment film and the first polarizer, and the second electrode is disposed between the second alignment film and the second polarizer.

A third aspect of embodiments of the present disclosure provides a display apparatus. The display apparatus includes the display assembly provided in any one of the above embodiments, and front member(s) disposed on a side of the light valve away from the display panel. Border(s) of orthographic projection(s) of the front member(s) on the back side are located within the border(s) of the orthographic projection(s) of the second display area(s) on the back side.

In some embodiments of the present disclosure, the front member(s) include at least one of a front camera unit or an infrared sensor unit.

In some embodiments of the present disclosure, the front member(s) include a front camera unit, and the front member(s) further include a front soft light lamp arranged side by side with the front camera unit.

In some embodiments of the present disclosure, the display apparatus further includes a first driving circuit configured to drive the display panel to display an image, and a second driving circuit configured to drive the light valve to control passage of light.

In some embodiments of the present disclosure, the display apparatus further includes a printed circuit board, and the first driving circuit and the second driving circuit are both coupled to the printed circuit board.

A fourth aspect of embodiments of the present disclosure provides a drive method for the display apparatus provided in any one of the above embodiments. The drive method includes; driving the second display area(s) to display a solid color image or not to display an image and driving the light valve to be turned on in response to turning on the front member(s), so that the light directed to the back side of the display panel passes through the light valve; and driving the second display area(s) to display an image and driving the light valve to be turned off in response to turning off the front member(s), so that the light directed to the back side of the display panel does not pass through the light valve.

In some embodiments of the present disclosure, the step of driving the second display area(s) to display a solid color image or not to display an image and driving the light valve to be turned on in response to turning on the front member(s), so that the light directed to the back side of the display panel passes through the light valve, includes: acquiring an image to be displayed, driving the first display area to display the image to be displayed, driving the second display area(s) to display a solid color image or stopping driving the second sub-pixels in the second display area(s), and driving the light valve to be turned on, so that the light directed to the back side of the display panel passes through the light valve. The step of driving the second display area(s) to display an image and driving the light valve to be turned off in response to turning off the front member(s), so that the light directed to the back side of the display panel does not pass through the light valve, includes: acquiring an image to be displayed, driving the first display area to display a portion of the image to be displayed corresponding to the first display area, driving the second display area(s) to display portion(s) of the image to be displayed corresponding to the second display area(s), and driving the light valve to be turned off, so that the light directed to the back side of the display panel does not pass through the light valve.

In some embodiments of the present disclosure, the light valve includes the first polarizer and the second polarizer with mutually perpendicular polarization directions, and the liquid crystal cell. The liquid crystal cell includes the liquid crystal layer, the first alignment film and the second alignment film that are disposed on opposite sides of the liquid crystal layer, and the first electrode and the second electrode that are used for driving the liquid crystal molecules in the liquid crystal layer to rotate. The first electrode is disposed between the first alignment film and the first polarizer, and the second electrode is disposed between the second alignment film and the second polarizer. The step of driving the light valve to be turned on includes: stopping inputting a voltage signal to the light valve for driving the liquid crystal molecules in the liquid crystal layer to rotate. The step of driving the light valve to be turned off includes: inputting a voltage signal to the light valve to form an electric field, so as to drive the liquid crystal molecules in the liquid crystal layer to rotate.

BRIEF DESCRIPTION OF THE DRAWINGS

In order to describe technical solutions in embodiments of the present disclosure or the prior art more clearly, the accompanying drawings to be used in description of embodiments or the prior art will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

In order to make the objectives, technical solutions and advantages of embodiments of the present disclosure clearer, the technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments obtained on the basis of the embodiments of the present disclosure by a person of ordinary skill in the art without paying any creative effort shall be included in the protection scope of the present disclosure.

In the related art, as shown in FIG. 1(a), in an example where the display apparatus is a mobile phone, the mobile phone includes a display area 01 and a non-display area 02 surrounding the display area 01. A portion of the non-display area 02 includes device(s) 02a (for example, one or more of a front camera unit, a light sensor, a distance sensor, or a biosensor). However, remaining portions of the non-display area 02 do not include the device(s) 02a, and these portions cannot display an image, resulting in a relatively low screen-to-body ratio.

With the advent of technologies such as special-shaped cutting, a solution is put forward in the related art that a shape of the display area may be changed from a traditional rectangle to a rectangle having a notch, and the device(s) may be included in a non-display area outside the notch, so that a ratio of the area of the display area to an area of an entire front surface of the display apparatus may be increased.

Figure 1:
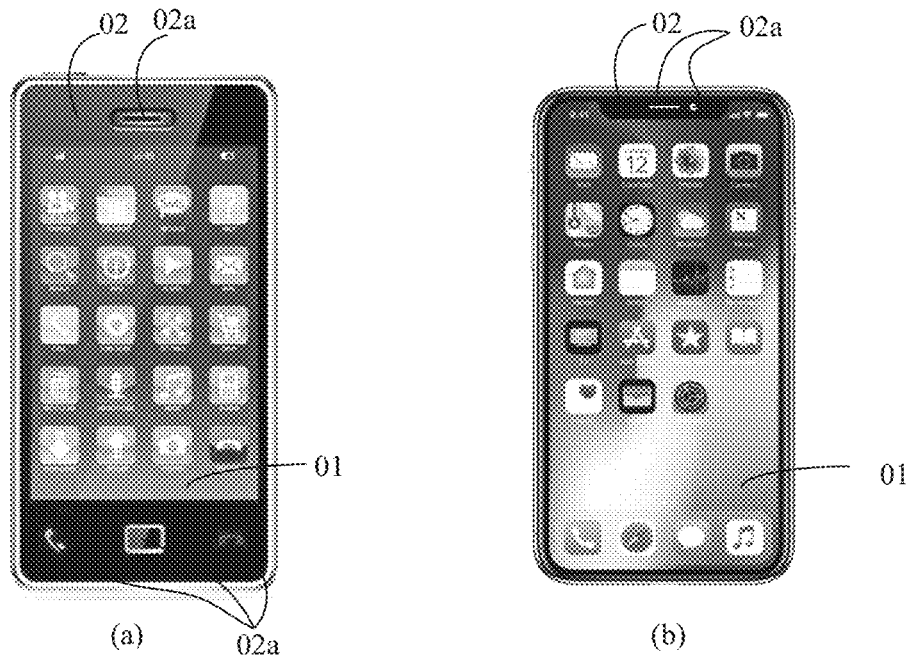
FIG. 1 is a schematic diagram comparing structures of two display devices, in accordance with the related art.

With continued reference to FIG. 1, as shown in part (b) of FIG. 1, still in the example where the display apparatus is the mobile phone, "a hole" is punched in a display panel by means of special-shaped cutting technology. That is, a notch is formed in a portion of an edge of the display area 01. Therefore, in the front surface of the mobile phone, a region where the above device(s) 02a need to be disposed is the non-display area 02, and remaining regions are the display area 01. In this way, the screen-to-body ratio of the display apparatus may be increased to some extent.

However, a region outside the notch is still a non-display area. That is, the display apparatus still includes other non-display area(s) 02, which affects the screen-to-body ratio of the display apparatus.

Figure 2:
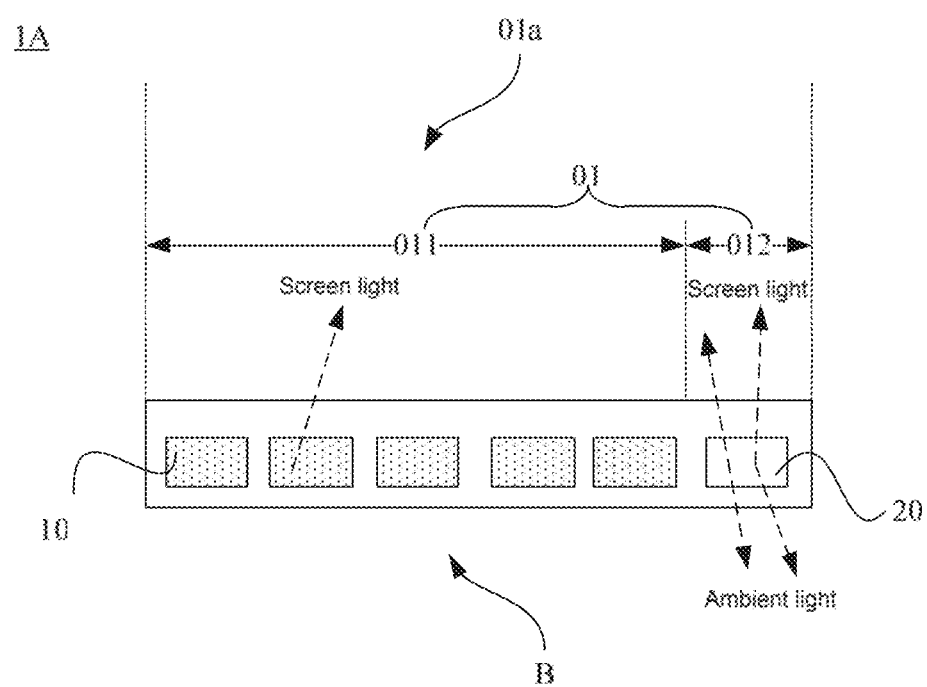
FIG. 2 is a schematic cross-sectional diagram showing a structure of a part of a display panel, in accordance with embodiments of the present disclosure.

Embodiments of the present disclosure provide a display panel. As shown in FIG. 2, the display panel 1A includes a display area 01. The display area 01 includes a first display area 011 and second display area(s) 012. The first display area 011 includes first sub-pixels 10, and the second display area(s) 012 includes second sub-pixels 20. The first display area 011 is a non-transparent display area, and the second display area(s) 012 are transparent display area(s).

With continued reference to FIG. 2, the display area 01 of the display panel 1A is divided into two parts—the first display area 011 and the second display area 012.

The first display area 011 is a non-transparent display area. In the first display area 011, light emitted by the first sub-pixels 10 (i.e., screen light) is able to exit from a display side 01a of the display panel 1A, but ambient light outside the display panel is not able to pass through the display panel 1A. That is, in the first display area 011, the ambient light is not able to enter from the display side 01a of the display panel 1A, pass through the first sub-pixels 10, and then exit from a back side B of the display panel 1A.

The second display area 012 is a transparent display area. In the second display area 012, light emitted by the second sub-pixels 20 (i.e., screen light) is able to exit from the display side 01a of the display panel 1A, and the ambient light outside the display panel 1A is able to pass through the display panel 1A. That is, in the second display area 012, the ambient light is able to enter from the display side 01a of the display panel 1A, pass through the second sub-pixels 20, and then exit from the back side B of the display panel 1A. Conversely, the ambient light is also able to enter from the back side B of the display panel 1A, pass through the second sub-pixels 20, and then exit from the display side 01a of the display panel 1A.

Dotted lines with arrows in FIG. 2 represent paths of the screen light and the ambient light. The display side 01a of the display panel 1A is a side of the display panel 1A for displaying an image. In a direction perpendicular to a panel surface of the display panel 1A, of two opposite sides of the display panel 1A, one side is the display side 01a, and another side is the back side B. That is, the back side B is a side of the display panel that is opposite to the display side 01a.

The first display area 011 includes the first sub-pixels 10, which are non-transparent sub-pixels. The light emitted by the first sub-pixels is not able to exit from the back side B of the display panel 1A, and is only able to exit from the display side 01a of the display panel 1A. The number and arrangement manner of the first sub-pixels 10 are not limited in embodiments of the present disclosure, as long as the first display area 011 is a non-transparent display area. The number and arrangement in FIG. 2 are for illustrative purposes only.

The second display area 012 includes the second sub-pixels 20, which are transparent sub-pixels. The light emitted by the second sub-pixels 20 is able to exit from both the display side 01a and the back side B of the display panel 1A. The number and arrangement of the second sub-pixels 20 are not limited in embodiments of the present disclosure, as long as the second display area(s) 012 are transparent display area(s). The number and arrangement in FIG. 2 are for illustrative purposes only.

That is, a situation where the first sub-pixels 10 and the second sub-pixels 20 are both located in the first display area 011 or both located in the second display area(s) 012 will not occur.

In the related art, in an example where the display apparatus is a mobile phone, the mobile phone is provided with a front member (for example, at least one of a front camera unit, an infrared sensor, a light sensor, a distance sensor, or a biosensor). The front member is for example a front camera unit (i.e., a camera commonly used for taking selfies, also known as a front camera), in order to set a lens of the front camera unit toward the display side of the display panel, so as to realize a front camera function (i.e., taking a picture or shooting a video of a person or an object located at the display side), in the related art, a manner of punching holes to expose the lens of the front camera is usually adopted.

In a case where the display panel 1A provided in embodiments of the present disclosure is applied to a display apparatus, in an example where the display apparatus is a mobile phone and the front member in the mobile phone is a front camera unit, in a selfie mode (i.e., when the front camera unit is turned on), the first display area 011 is configured to display an image normally and the second display area(s) 012 are configured to not display an image. Since the second display area(s) 012 are transparent display area(s), the ambient light is able to pass through the second display area(s) 012. In this case, by arranging the front camera unit at the back side B of the display panel 1A, the ambient light may pass through the second display area(s) 012 of the display panel 1A, and then reach the front camera unit. In this way, the front camera unit disposed at the back side B of the display panel 1A may still achieve the front camera function. In a non-selfie mode (i.e., when the front camera unit is turned off), both the first display area 011 and the second display area(s) 012 of the display panel 1A are configured to display an image normally. That is, the entire display area 01 of the display panel 1A is able to display an image. In this way, it is not necessary to arrange the front member at the display side 01a of the display panel 1A. Therefore, the screen-to-body ratio of the display apparatus may be increased, and user experience may be improved.

Figure 3:
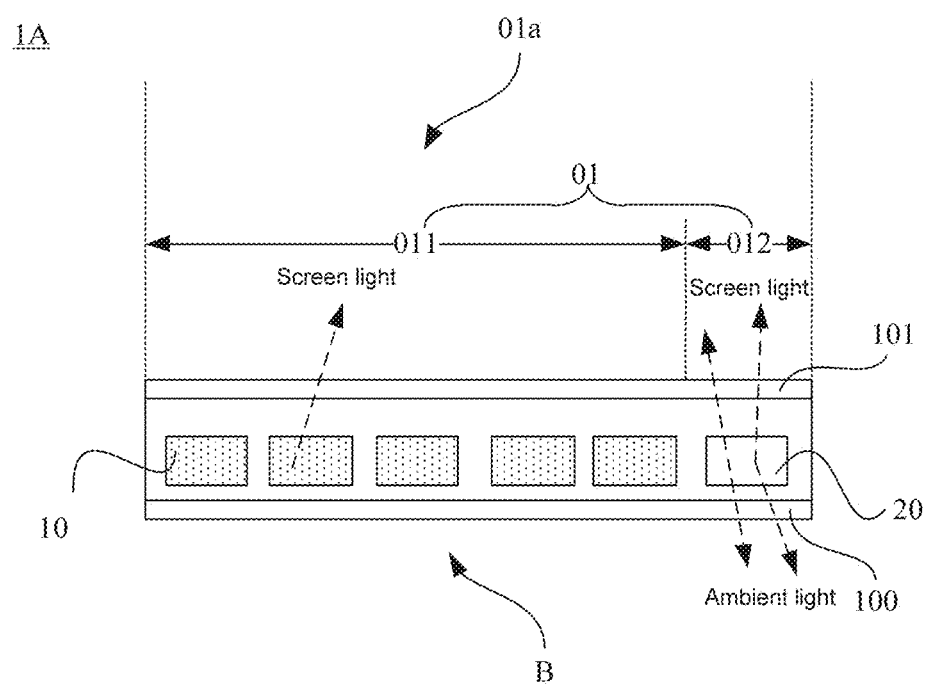
FIG. 3 is a schematic cross-sectional diagram showing a structure of a part of another display panel, in accordance with embodiments of the present disclosure.

As shown in FIG. 3, the display panel 1A provided in the embodiments of the present disclosure may further include: a base substrate 100 for arranging the above sub-pixels thereon, a transparent cover 101 disposed at the display side 01a, and other structural layers, which may be flexibly adjusted according to design requirements, and is not limited by the embodiments of the present disclosure.

In the embodiments of the present disclosure, the display panel 1A only includes the display area 01, and the display area 01 is divided into the first display area 011 and second display area(s) 012 with different internal structures. The display area 01 may be configured to have any shape as needed.

Embodiments of the present disclosure do not limit shapes of the first display area 011 and the second display area(s) 012 and a positional relationship therebetween, which may be reasonably set according to functional requirements of different display panels.

Figure 4:
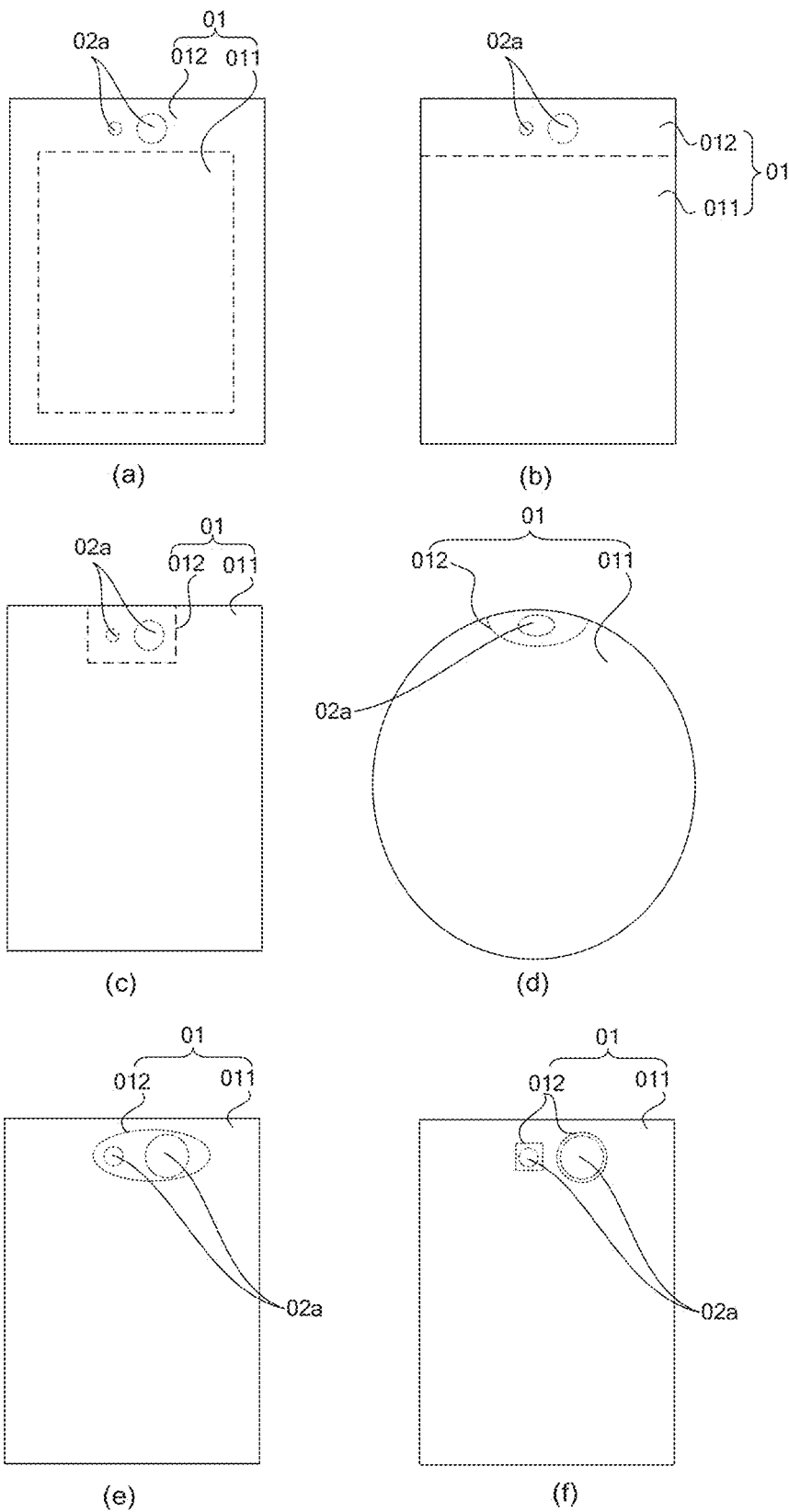
FIG. 4 is a combination of schematic top views of a group of display panels, in accordance with embodiments of the present disclosure.

For example, as shown in part (a) of FIG. 4, the second display area 012 is disposed around the first display area 011. That is, the first display area 011 is located at a center of the display area 01, and the second display area 012 surrounds the first display area 011.

Or, as shown in part (b), part (c), and part (d) of FIG. 4, the second display area 012 is disposed at an outer edge of the first display area 011.

As shown in part (d) of FIG. 4, the second display area 012 may be disposed at a border of the display area 01, and has a shape matching a shape of the border.

Or, as shown in part (e) and part (f) of FIG. 4, the first display area 011 is disposed around the second display area(s) 012, and a shape of the second display area(s) 012 may be, for example, square or round (for example, part (e) of FIG. 4 shows an example in which the shape of the second display area 012 is oval, and part (f) of FIG. 4 shows an example in which the shapes of the second display areas 012 are round and square). Moreover, the number of the second display area(s) 012 may be one, as shown in part (e) of FIG. 4; or, the number of the second display area(s) 012 may be more than one (for example, two), as shown in part (f) of FIG. 4.

As shown in part (f) of FIG. 4, the second display areas 012 may have a shape matching a shape of a structure under the display panel (for example, the front member 02a), or any other closed shape.

Shapes of the first display area 011 and the second display area(s) 012 and positional relationships therebetween as shown in FIG. 4 are for illustrative purposes only. Of course, a non-display area occupying a small portion of the screen may also be disposed at the edge of the display area as needed.

In this way, by arranging the front member(s) 02a at the back side of the display panel 1A and in the second display area(s) 012, it is possible to make sure the front member(s) 02a do not occupy a region in the display area of the display panel 1A and thus increase the screen-to-body ratio of the display apparatus.

Figure 5:
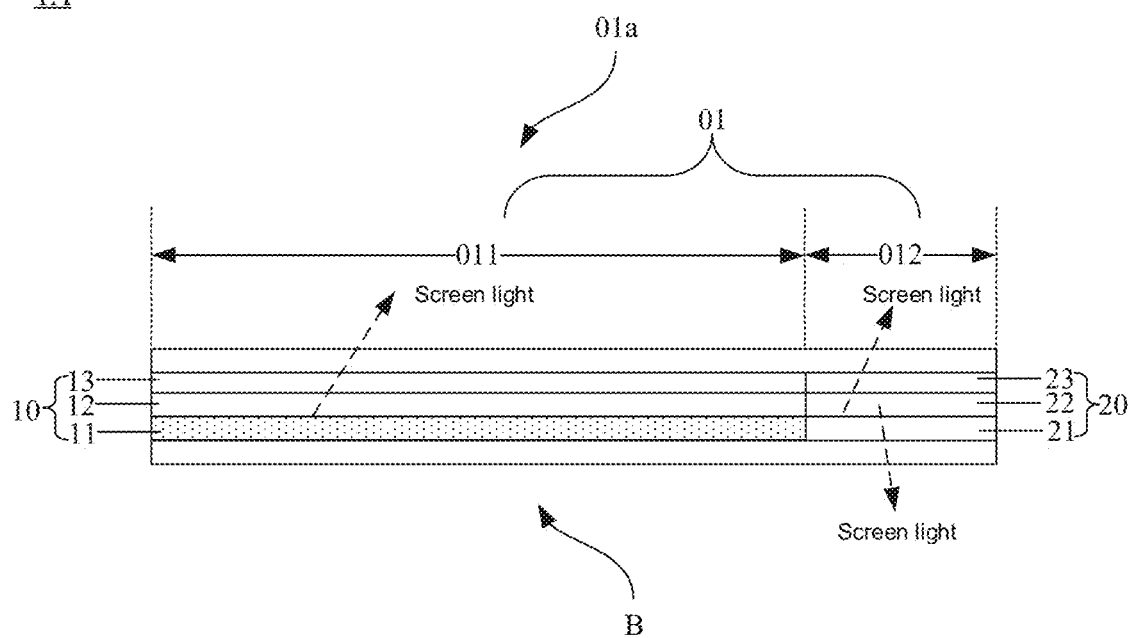
FIG. 5 is a schematic cross-sectional diagram showing a structure of yet another display panel, in accordance with embodiments of the present disclosure.

As an arrangement manner, as shown in FIG. 5, the first sub-pixel 10 includes a reflective electrode layer 11, a first electroluminescent layer 12, and a first transmissive electrode layer 13 that are disposed in a stack; and the second sub-pixel 20 includes a second transmissive electrode layer 21, a second electroluminescent layer 22, and a third transmissive electrode layer 23 that are disposed in a stack.

In the first sub-pixel 10, the reflective electrode layer 11 is disposed closer to a back side B of the display panel 1A than the first electroluminescent layer 12, and is configured to reflect light emitted by the first electroluminescent layer 12 (i.e., screen light), so that the light emitted by the first sub-pixels 10 exits from only one side.

In the second sub-pixel 20, since electrode layers respectively located at both sides of the second electroluminescent layer 22 are transmissive electrode layers (i.e., transparent electrode layers or electrode layers with a high transmittance), light emitted by the second electroluminescent layer 22 (i.e., screen light) may exit from both the second transmissive electrode layer 21 and the third transmissive electrode layer 23.

A material of any one of the first transmissive electrode layer 13, the second transmissive electrode layer 21, and the third transmissive electrode layer 23 may be a transparent conductive material (such as Aluminium-doped zinc oxide (AZO), Indium tin oxide (ITO), and Fluorine-doped Tin Oxide (FTO)) or a metallic conductive material (such as Au, Ag, Pt, Cu, Rh, Pd, Al, and Cr). In a case where the material is a metallic conductive material, a metal layer may be made very thin, so that light can pass through the electrode layer.

The first electroluminescent layer 12 and the second electroluminescent layer 22 may be separated from each other (i.e., unconnected or disconnected), or may be connected (that is, a luminescent layer is divided into two parts located in different regions). FIG. 5 only shows an example in which the first electroluminescent layer 12 and the second electroluminescent layer 22 are connected.

Similarly, the first transmissive electrode layer 13 and the third transmissive electrode layer 23 may be separated from each other (i.e., unconnected or disconnected), or may of course be connected (that is, a transmissive electrode layer is divided into two parts located in different regions). FIG. 5 only shows an example in which the first transmissive electrode layer 13 and the third transmissive electrode layer 23 are connected.

By providing the reflective electrode layer 11 in the first sub-pixel 10, on one hand, the light emitted by the first electroluminescent layer 12 may be prevented from exiting from the back side B of the display panel 1A; on another hand, the light emitted by the first electroluminescent layer 12 may be reflected. In this way, the light emitted by the first electroluminescent layer 12 may exit from the first transmissive electrode layer 13 as much as possible, and a display effect may be improved.

A material of the reflective electrode layer 11 may be, for example, a metal with a high reflectance, such as a simple substance or an alloy of copper, aluminum, or silver.

In the embodiments of the present disclosure, the first sub-pixel 10 is configured to include the reflective electrode layer 11, the first electroluminescent layer 12, and the first transmissive electrode layer 13 that are disposed in a stack, so that the ambient light is not able to pass through the first display area 011; and the second sub-pixel 20 is configured to include the second transmissive electrode layer 21, the second electroluminescent layer 22 and the third transmissive electrode layer 23 that are disposed in a stack, so that the ambient light is able to pass through the second display area 012. This structure is simple and easy to implement.

Figure 6:
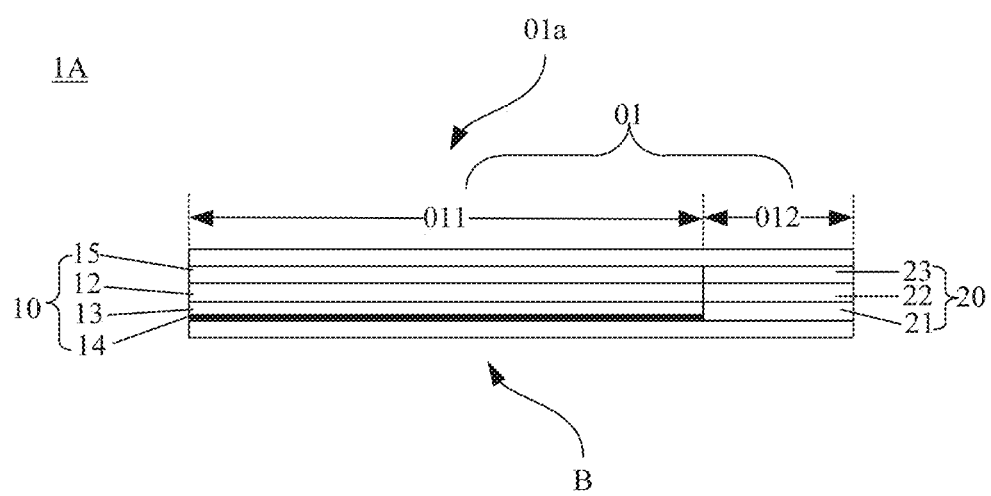
FIG. 6 is a schematic cross-sectional diagram showing a structure of yet another display panel, in accordance with embodiments of the present disclosure.

As another arrangement manner, as shown in FIG. 6, the first sub-pixel 10 includes a reflective layer 14, a first transmissive electrode layer 13, a first electroluminescent layer 12, and a fourth transmissive electrode layer 15 that are disposed in a stack; and the second sub-pixel 20 includes a second transmissive electrode layer 21, a second electroluminescent layer 22, and a third transmissive electrode layer 23 that are disposed in a stack.

In the first sub-pixel 10, the reflective layer 14 is disposed closer to the back side B of the display panel 1A than the first transmissive electrode layer 13, and is configured to reflect the light emitted by the first electroluminescent layer 12 (i.e., the screen light), so that the light emitted by the first sub-pixels 10 exits from only one side.

In the second sub-pixel 20, since electrode layers respectively located at both sides of the second electroluminescent layer 22 are transmissive electrode layers (i.e., transparent electrode layers or electrode layers with a high transmittance), the light emitted by the second electroluminescent layer 22 (i.e., the screen light) may exit from both the second transmissive electrode layer 21 and the third transmissive electrode layer 23.

A material of any one of the first transmissive electrode layer 13, the second transmissive electrode layer 21, the third transmissive electrode layer 23, and the fourth transmissive electrode layer 15 may be a transparent conductive material (such as Aluminium-doped zinc oxide (AZO), Indium tin oxide (ITO), and Fluorine-doped Tin Oxide (FTO) or a metallic conductive material (such as Au, Ag, Pt, Cu, Rh, Pd, Al, and Cr). In a case where the material is a metallic conductive material, the metal layer may be made very thin, so that the light can pass through the electrode layer.

The first electroluminescent layer 12 and the second electroluminescent layer 22 may be separated from each other (i.e., unconnected or disconnected), or may of course be connected (that is, the luminescent layer is divided into two parts located in different regions). FIG. 6 only shows an example in which the first electroluminescent layer 12 and the second electroluminescent layer 22 are connected.

Similarly, the third transmissive electrode layer 23 and the fourth transmissive electrode layer 15 may be separated from each other (i.e., unconnected or disconnected), or may of course be connected (that is, the transmissive electrode layer is divided into two parts located in different regions). FIG. 6 only shows an example in which the third transmissive electrode layer 23 and the fourth transmissive electrode layer 15 are connected.

By providing the reflective layer 14 in the first sub-pixel 10, on one hand, the light emitted by the first electroluminescent layer 12 may be prevented from exiting from the back side B of the display panel 1A; on another hand, the light emitted by the first electroluminescent layer 12 may be reflected. In this way, the light emitted by the first electroluminescent layer 12 may exit from the first transmissive electrode layer 13 as much as possible, and the display effect may be improved.

Embodiments of the present disclosure do not limit a material and thickness of the reflective layer 14. For example, the material may be a metal with a high reflectance, such as a simple substance or an alloy of copper, aluminum, or silver.

In this way, transmissive electrode layers in the first sub-pixel 10 and the second sub-pixel 20 may be formed in a same patterning process, making it easier to manufacture the transmissive electrode layers with fewer processes. In any one of the above arrangement manners, the first sub-pixel 10 and the second sub-pixel 20 may both further include at least one of a hole injection layer, a hole transport layer, an electron injection layer, or an electron transport layer (not shown in FIGS. 5 and 6).

The hole injection layer and the hole transport layer are disposed between the first electroluminescent layer 12 and a corresponding electrode layer that is used as an anode (i.e., provides holes). The hole injection layer is disposed proximate to the electrode layer, and the hole transport layer is disposed proximate to the first electroluminescent layer 12. The electron injection layer and the electron transport layer are disposed between the first electroluminescent layer 12 and a corresponding electrode layer that is used as a cathode (i.e., provides electrons). The electron injection layer is disposed proximate to the electrode layer, and the electron transport layer is disposed proximate to the first electroluminescent layer 12.

Similarly, the hole injection layer and the hole transport layer are disposed between the second electroluminescent layer 22 and a corresponding electrode layer that is used as an anode (i.e., provides holes). The hole injection layer is disposed proximate to the electrode layer, and the hole transport layer is disposed proximate to the second electroluminescent layer 22. The electron injection layer and the electron transport layer are disposed between the second electroluminescent layer 22 and a corresponding electrode layer that is used as a cathode (i.e., provides electrons). The electron injection layer is disposed proximate to the electrode layer, and the electron transport layer is disposed proximate to the second electroluminescent layer 22.

A material of the hole injection layer may be, for example, 2,3,5,6-Tetrafluoro-7,7,8,8-tetracyanoquinodimethane (F4TCNQ), 7,7,8,8-tetracyanoquinodimethane (TCNQ), 2,3,6,7,10,11-hexacyano-1,4,5,8,9,12-hexaazatriphenylene (HAT-ON), or 4,4',4"-tris (2-naphthylphenylamino)triphenylamine (2T-NATA).

A material of the hole transport layer may be, for example, a triarylamine type material, a biphenyldiamine derivative, or a diamine biphenyl with a cross-linked structure, such as N,N'-diphenyl-N,N'(1-naphthyl)-1,1'-biphenyl-4,4'-diamine (NPB), 4,4',4"-tri (9-carbazoyl)triphenylamine (TCTA), or 4,4',4"-tris(N-3-methylphenyl-N-phenylamino)triphenylamine (m-MTDATA).

A material of the electron injection layer may be, such as tetraphenylcyclopentadienone (TPCD), 3'-phenyl-3'H-cyclopropane [1,9][5,6]fullerene-C60-Ih-3'-methyl butyrate (PCBM), 1,3-bis(2,6-diisopropylphenyl) imidazolium chloride (BPMZ), 1-(2-bromoethoxy)-4-chlorobenzene (BOB), [6,6]-phenyl-C71-butyric acid methyl ester ([70] PCBM), poly(3-hexylthiophene-2,5-diyl) (P3HT), or 2,2',7,7'-tetrakis[N,N-di(4-methoxyphenyl)amino]-9,9'-spirobifluorene (Spiro-MeOTAD).

A material of the electron transport layer may be a metal chelate compound, an azole compound, a phenanthroline derivative, or the like, such as tris(8-hydroxyquinoline) aluminum (AlQ3), 4,7-diphenyl-1,10-phenanthroline (BPhen), 1,3,5-tris[(3-pyridyl)-3-phenyl]benzene (TmPyPB), or 2,2'-(1,3-phenyl)bis[5-(4-tert-butylphenyl)-1,3,4-oxadiazole] (OXD-7).

In order to improve the display effect, with continued reference to FIG. 4, an area of the first display area 011 is greater than an area of the second display area(s) 012. And as shown in part (b), part (c), and part (d) of FIG. 4, the second display area 012 is disposed at an edge of the display panel 1A.

That is to say, a ratio of the first display area 011 to the display area 01 is greater than a ratio of the second display area 012 to the display area 01, and at least one edge of a contour of the second display area 012 overlaps with a contour of the display side of the display panel 1A.

Figure 7:
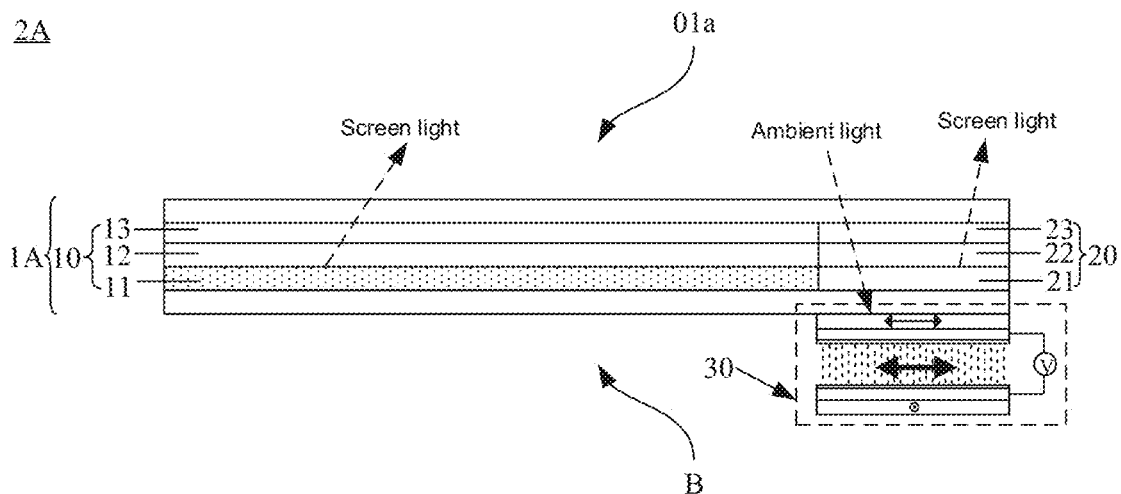
FIG. 7 is a schematic cross-sectional diagram showing a structure of a display assembly, in accordance with embodiments of the present disclosure.

Embodiments of the present disclosure provide a display assembly. As shown in FIG. 7, the display assembly 2A includes the display panel 1A described above, and a light valve 30 disposed at the back side B of the display panel 1A. The back side B is a side of the display panel 1A that is opposite to the display side 01*a*. Border(s) of orthographic projection(s) of the second display area(s) 012 on the back side B are located within a border of an orthographic projection of the light valve 30 on the back side B, and the light valve 30 is configured to allow or block light directed to the back side B of the display panel 1A to pass through the light valve 30.

The light valve 30 and the display panel 1A may be integrated together during a manufacturing process. That is, the light valve 30 is formed at the back side B of the display panel 1A at a same time when the display panel 1A is manufactured. Border(s) of orthographic projection(s) of the second display area(s) 012 on the back side B are located within the border of the orthographic projection of the light valve 30 on the back side B.

Or, the light valve 30 and the display panel 1A may be manufactured separately, and then assembled together to form the display assembly 2A.

Border(s) of orthographic projection(s) of the second display area(s) 012 on the back side B are located within a border of an orthographic projection of the light valve 30 on the back side B means that, the border of the orthographic projection of the light valve 30 on the back side B at least overlaps with the border(s) of the orthographic projection(s) of the second display area(s) 012 on the back side B, so as to allow or block light (the screen light and the ambient light) that penetrates the second display area 012 to pass through the light valve 30.

A specific structure of the light valve 30 is not limited in the embodiments of the present disclosure, and FIG. 7 is merely an example, as long as the light valve 30 is a corresponding component that is capable of controlling whether light is or is not able to pass through itself in different situations.

The light directed to the back side B of the display panel 1A includes the ambient light and the light emitted by the second electroluminescent layer 22.

In a case where the display assembly 2A provided in the embodiments of the present disclosure is applied to a display apparatus, in the example where the display apparatus is a mobile phone and the front member disposed in the mobile phone is a front camera unit, in the selfie mode, the second display area(s) 012 are configured to not display an image; and at the same time, the light valve 30 controls the light directed to the back side B of the display panel 1A to pass through the light valve 30 and directed to the front camera unit located at the back side B of the display panel 1A. In this way, the front camera unit disposed at the back side B of the display panel 1A may be able to capture an image in front of the display side 01*a* of the display panel 1A, and the first display area 011 may be controlled to display the image captured by the front camera unit.

In the non-selfie mode, both the first display area 011 and the second display area(s) 012 are configured to display an image; and at the same time, the light valve 30 controls the light directed to the back side B of the display panel 1A to not pass through the light valve 30. In this way, the front camera unit located at the back side B of the display panel 1A may not be seen by a user at the display side 01 of the display panel 1A, and an image to be displayed may be displayed by both the first display area 011 and the second display area(s) 012 of the display panel 1A together.

Therefore, the display apparatus including the display assembly 2A provided in embodiments of the present disclosure may be able to increase the screen-to-body ratio of the display apparatus on a basis of realizing corresponding functions of the front member(s).

The front member may be, for example, a front camera unit, an infrared sensor, or other sensing devices with similar functions.

Figure 8:
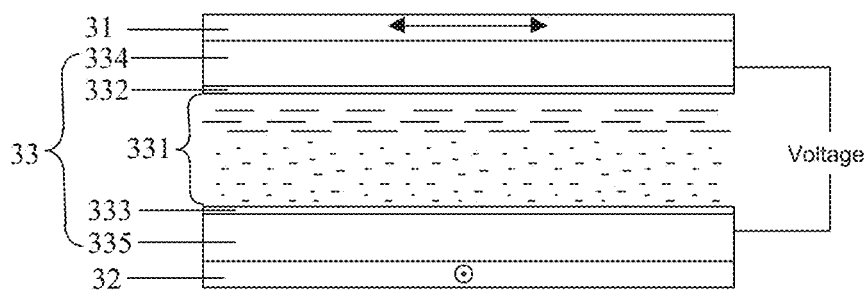
FIG. 8 is a schematic cross-sectional diagram showing a structure of a light valve in a display assembly, in accordance with embodiments of the present disclosure.

For example, as shown in FIG. 8, the light valve 30 includes a first polarizer 31 and a second polarizer 32 with mutually perpendicular polarization directions, and a liquid crystal cell 33. The first polarizer 31 and the second polarizer 32 are disposed on two opposite surfaces of the liquid crystal cell 33.

The liquid crystal cell 33 includes a liquid crystal layer 331, a first alignment film 332 and a second alignment film 333 that are disposed at both sides of the liquid crystal layer 331 respectively, and a first electrode 334 and a second electrode 335 that are used for driving liquid crystal molecules in the liquid crystal layer 331 to rotate.

In FIG. 8, symbols "↔" and "⊙" are used to indicate polarization directions of the first polarizer 31 and the second polarizer 32 respectively, which are perpendicular to each other.

Certain pretilt angles may be set for liquid crystal molecules in the liquid crystal layer 331 as needed.

Herein, the "pretilt angles" refer to predetermined angles at which the liquid crystal molecules are arranged on a surface of an alignment film without being subjected to an applied voltage. By setting corresponding pretilt angles for the liquid crystal molecules on the alignment film, it is possible to ensure that the liquid crystal molecules rotate toward a same direction when subjected to an applied voltage, and achieve uniform alignment.

A manner and principle of setting the pretilt angles may be, for example: rubbing a surface of a polyimide film forming the alignment film, so that polyimide molecules are arranged along a rubbing direction. The polyimide molecules are arranged in a spiral and form an electrostatic field. Due to anisotropy of the liquid crystal molecules, in the electrostatic field, there will be a certain inclination (i.e., a pretilt angle) between the arranged liquid crystal molecules and a plane where the alignment film is located.

That is, the light valve 30 is equivalent to a small-sized liquid crystal panel, and is capable of controlling whether light traveling through the transparent second display area(s) 012 toward the back side B of the display panel 1A is able to pass through the light valve 30 by controlling deflection of the liquid crystal molecules. A technology of manufacturing a liquid crystal panel is very mature with a simple structure and low cost. Moreover, the light valve 30 may be simultaneously manufactured in a process of manufacturing the display panel.

For example, with continued reference to FIG. 8, the first electrode 334 is disposed between the first alignment film 332 and the first polarizer 31, and the second electrode 335 is disposed between the second alignment film 333 and the second polarizer 32. That is, by applying different potentials on the first electrode 334 and the second electrode 335, an electric field perpendicular to the liquid crystal layer 331 (i.e., a perpendicular electric field) may be formed between the first electrode 334 and the second electrode 335, and the liquid crystal molecules in the liquid crystal layer 331 may be driven to rotate.

Of course, the first electrode and the second electrode may also be disposed in a same layer as the liquid crystal layer, and may form a fringe electric field to drive the liquid crystal molecules to rotate. A specific structure and principle are not limited in the embodiments of the present disclosure, and reference may be made to the related design.

Figure 9:
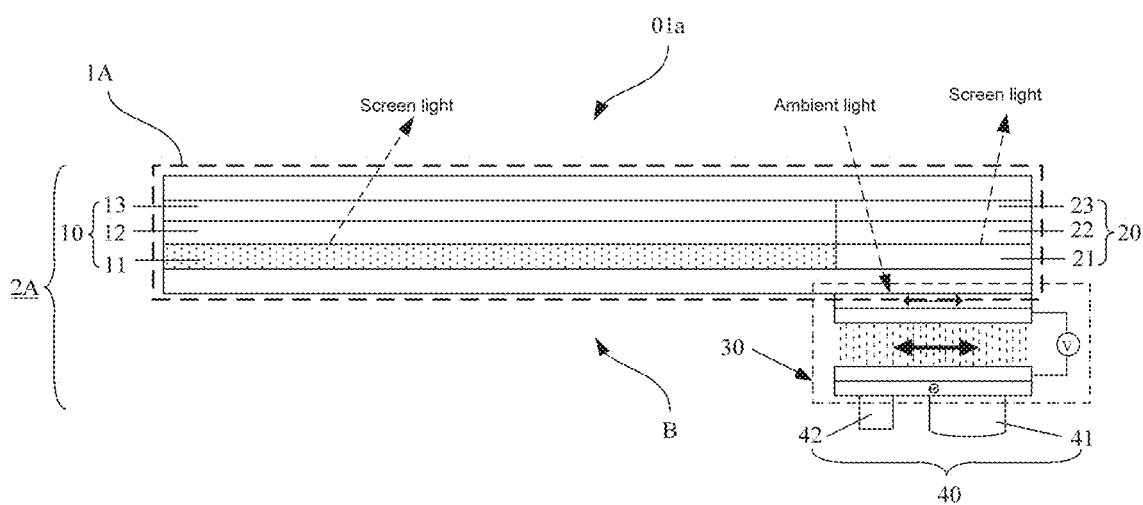
FIG. 9 is a schematic cross-sectional diagram showing a structure of a display apparatus, in accordance with embodiments of the present disclosure.
Figure 10:
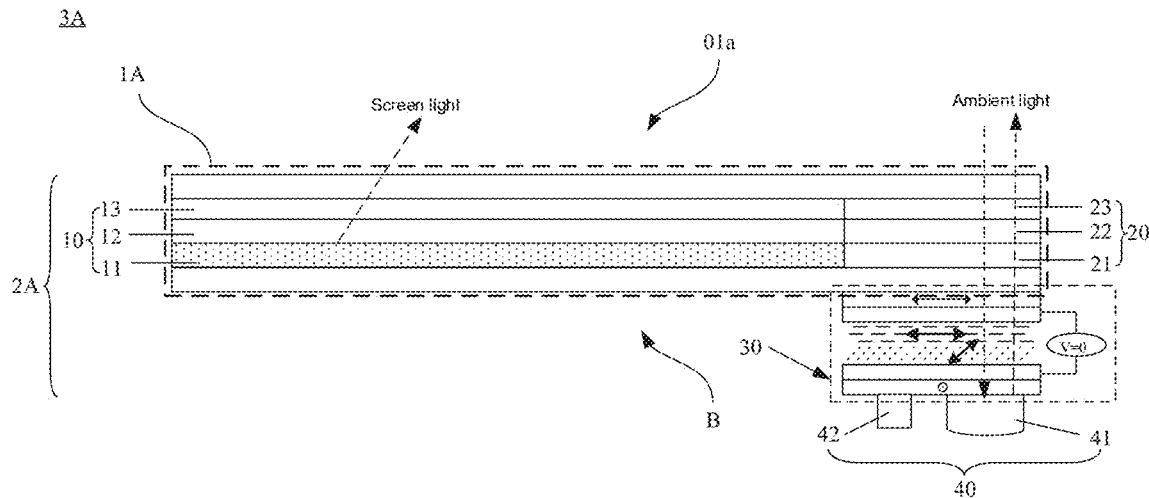
FIG. 10 is a schematic cross-sectional diagram showing a structure of another display apparatus, in accordance with embodiments of the present disclosure.

Embodiments of the present disclosure further provide a display apparatus. As shown in FIGS. 9 and 10, the display apparatus 3A includes the display assembly 2A described above, and front member(s) 40 disposed on a side of the light valve 30 away from the display panel 1A (i.e., the back side B of the display panel 1A). Border(s) of orthographic projection(s) of the front member(s) 40 on the back side B are located within the border(s) of the orthographic projection(s) of the second display area(s) 012 on the back side B.

Herein, although the front member(s) 40 are disposed at the back side B of the display panel 1A, corresponding receiving surface(s) of the front member(s) 40 face toward the display side 01*a* of the display panel 1A, so as to realize front-facing function(s).

In a case where the front member(s) 40 include a front camera unit, the receiving surface refers to a lens of the front camera unit; in a case where the front member(s) 40 include an infrared sensor unit, the receiving surface refers to a sensing surface of the infrared sensor unit.

The front member(s) 40 may include a front camera unit 41, and may, of course, include an infrared sensor unit.

In a case where the front member(s) 40 include a front camera unit 41, in order to compensate for light intensity when taking pictures, so as to improve a selfie quality, with continued reference to FIGS. 9 and 10, the front member(s) 40 further include a front soft light lamp 42 arranged side by side with the front camera unit 41. That is, a border of an orthographic projection of the front soft light lamp 42 on the back side B is located within the border(s) of the orthographic projection(s) of the second display area(s) 012 on the back side B.

Light emitted by the front soft light lamp 42 is directed to the display side 01*a* of the display panel 1A.

Figure 11:
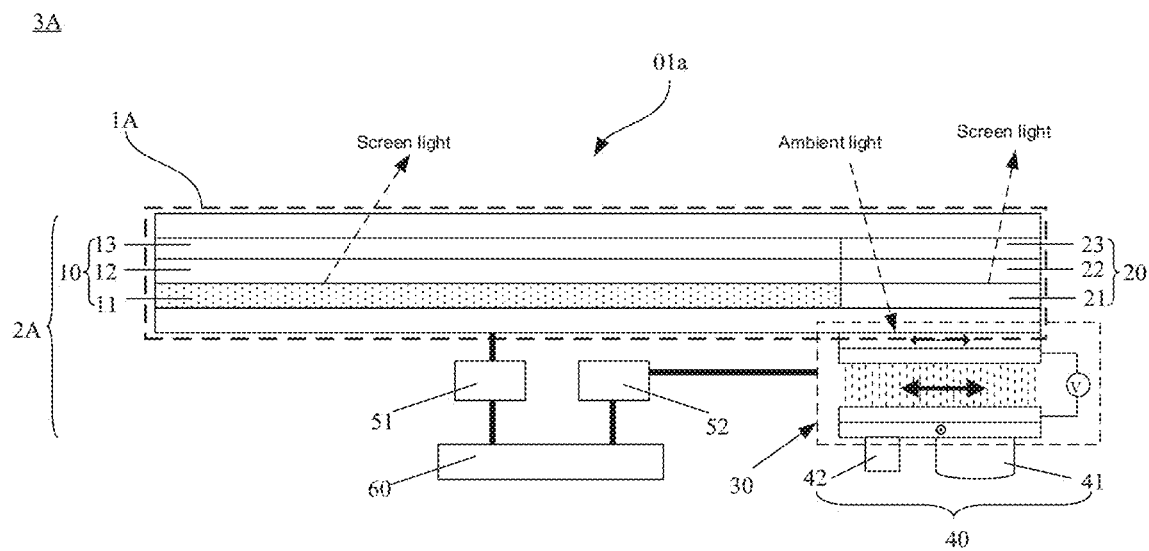
FIG. 11 is a schematic cross-sectional diagram showing a structure of yet another display apparatus, in accordance with embodiments of the present disclosure.

In order to simplify circuit layout and thus improve a degree of technical integration of the display apparatus 3A and reduce cost, as shown in FIG. 11, the display apparatus 3A further includes a first driving circuit 51 for driving the display panel 1A to display an image and a second driving circuit 52 for driving the light valve 30 to control passage of light. The driving circuit described above may be for example, application-specific integrated circuit (ASIC), Insulated Gate Bipolar Transistor (IGBT) driving circuit, or Metal-Oxide-Semiconductor Field Effect Transistor (MOSFET) drive circuit.

Further, the display apparatus 3A further includes a printed circuit board 60, and the first driving circuit 51 and the second driving circuit 52 are both coupled to the printed circuit board 60. The printed circuit board 60 is configured to provide drive signals to the first driving circuit 51 and the second driving circuit 52.

In an example where the front member 40(*s*) include a front camera unit 41, a working principle of the display apparatus 3A provided in the embodiments of the present disclosure is as follows.

With continued reference to FIG. 9, in a case where it is not necessary to turn on the front camera unit 41, the second display area 012 normally displays an image, and the light valve 30 controls the light to not pass through the light valve 30 itself.

For example, after a corresponding voltage is applied to the first electrode 334 and the second electrode 335 in the light valve 30, an electric field is formed and the liquid crystal molecules in the liquid crystal layer 331 in the light valve 30 are deflected to a direction perpendicular to the liquid crystal layer. After the light directed to the back side B of the display panel 1A (for example, the screen light in FIG. 9) passes through the upper polarizer having a polarization direction "↔", the deflected liquid crystal molecules will not change a polarization direction of the polarized light. That is, the polarization direction of the light will remain unchanged after the light passes through the liquid crystal layer 331, and is as shown by the symbol "↔" in the liquid crystal layer 331 in FIG. 9. However, a polarization direction of the lower polarizer represented by the symbol "⊙" is perpendicular to a polarization direction of the upper polarizer. As a result, the light is unable to pass through both the first polarizer 31 and the second polarizer 32 having orthogonal polarization directions.

Therefore, the light will not reach the front camera unit 41. That is, the front camera unit 41 may not be seen by the human eye and remains hidden.

With continued reference to FIG. 10, in a case where it is necessary to turn on the front camera unit 41, the second display area 012 is controlled to display a solid color image (for example, an image in white or other colors) or not to display an image, and the light valve 30 controls light to pass through the light valve 30 itself.

For example, a voltage is not applied to the first electrode 334 and the second electrode 335 in the light valve 30. In this case, the liquid crystal molecules are arranged in a twist, and the liquid crystal layer 331 may be able to deflect the polarization direction of the polarized light (usually by 90°, as shown by two double-sided arrows perpendicular to each other in the liquid crystal layer 331 in FIG. 10). Therefore, the ambient light may be able to pass through both the first polarizer 31 and the second polarizer 32 having orthogonal polarization directions and be further directed to the front camera unit 40. In this way, the front camera unit 40 may become visible and be able to work normally.

Therefore, the display apparatus 3A provided in the embodiments of the present disclosure, by providing two states—a display state and a non-display state—for the second display area(s) 012, may be possible to make the front member(s) 40 work normally in a case where the second display area(s) 012 are in the non-display state. In a case where it is not necessary for the front member(s) to work, the second display area(s) 012 and the first display area 011 may display an image together through cooperation. In this way, when an image is displayed, the entire display area 01 of the display panel 1A may display an image. As a result, the display apparatus 3A provided in the present disclosure has increased the screen-to-body ratio of the display area 01 in the display apparatus on the basis of achieving function(s) of the front member(s).

Figure 12:
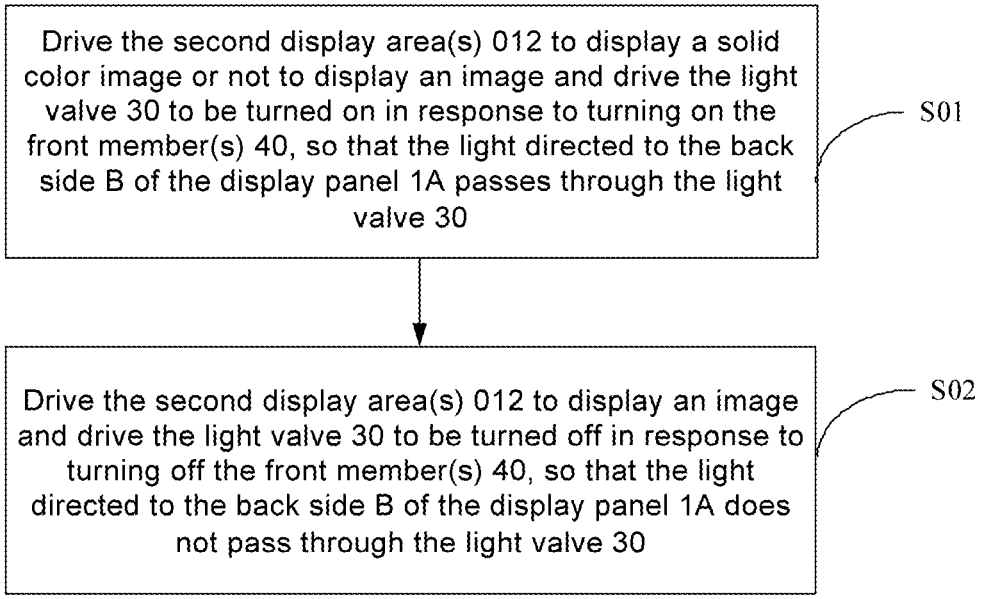
FIG. 12 is a schematic flow diagram of a drive method for a display apparatus, in accordance with embodiments of the present disclosure.

Embodiments of the present disclosure further provide a drive method for the display apparatus. As shown in FIG. 12, the drive method includes step 01 and step 02 (S01-S02):

S01: driving the second display area(s) 012 to display a solid color image or not to display an image and driving the light valve 30 to be turned on in response to turning on the front member(s) 40, so that the light directed to the back side B of the display panel 1A passes through the light valve 30; and S02: driving the second display area(s) 012 to display an image and driving the light valve 30 to be turned off in response to turning off the front member(s) 40, so that the light directed to the back side B of the display panel 1A does not pass through the light valve 30.

Figure 13:
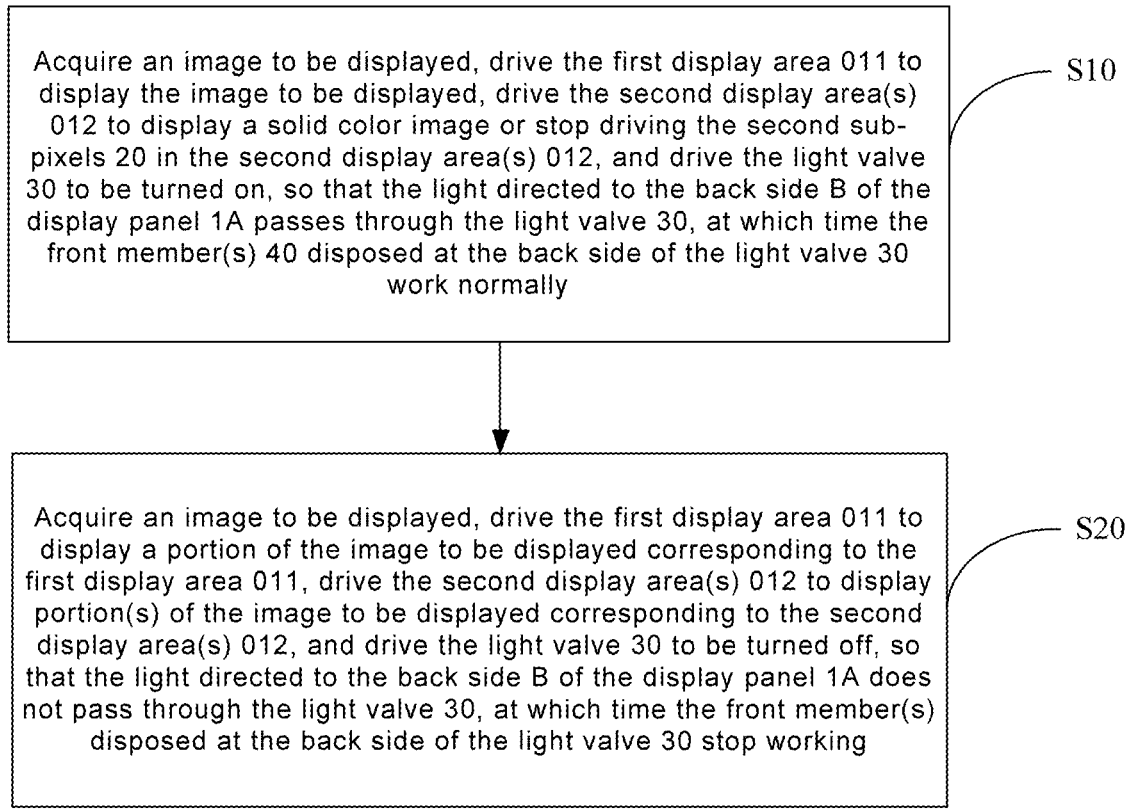
FIG. 13 is a schematic flow diagram of another drive method for a display apparatus, in accordance with embodiments of the present disclosure.

For example, as shown in FIG. 13, S01 includes step 10 (S10):

S10: acquiring an image to be displayed, driving the first display area 011 to display the image to be displayed, driving the second display area(s) 012 to display a solid color image or stopping driving the second sub-pixels 20 in the second display area(s) 012 (i.e., making the second display area(s) 012 not display an image), and driving the light valve 30 to be turned on, so that the light directed to the back side B of the display panel 1A passes through the light valve 30, at which time the front member(s) 40 disposed at the back side of the light valve 30 work normally.

In an example where the light valve 30 includes the first polarizer 31 and the second polarizer 32 with mutually perpendicular polarization directions, and the liquid crystal cell 33 disposed between the first polarizer 31 and the second polarizer 32; the liquid crystal cell 33 includes the liquid crystal layer 331, the first alignment film 332 and the second alignment film 333 that are disposed at both sides of the liquid crystal layer 331 respectively, and the first electrode 334 and the second electrode 335 that are disposed at both sides of the liquid crystal layer 331 respectively; the first electrode 334 is disposed between the first alignment film 332 and the first polarizer 31, and the second electrode 335 is disposed between the second alignment film 333 and the second polarizer 32, the step of driving the light valve 30 to be turned on includes: stopping inputting a voltage signal to the light valve 30 for driving the liquid crystal molecules to rotate. That is, no electric field is formed between the first electrode 334 and the second electrode 335.

For example, as shown in FIG. 13, S02 includes step 20 (S20):

S20: acquiring an image to be displayed, driving the first display area 011 to display a portion of the image to be displayed corresponding to the first display area 011, driving the second display area(s) 012 to display portion(s) of the image to be displayed corresponding to the second display area(s) 012 (i.e., making both the first display area 011 and the second display area(s) 012 display the image together), and driving the light valve 30 to be turned off, so that the light directed to the back side B of the display panel 1A does not pass through the light valve 30, at which time the front member(s) disposed at a back side of the light valve 30 stop working.

Herein, in the example where the light valve 30 has the above structure, the step of driving the light valve 30 to be turned off includes: inputting a voltage signal to the light valve 30 to form an electric field, so as to drive the liquid crystal molecules in the liquid crystal layer 331 to rotate through the electric field. That is, an electric field is formed between the first electrode 334 and the second electrode 335.

Beneficial effects that may be achieved by the drive method for the display apparatus 3A provided in the embodiments of the present disclosure are the same as beneficial effects that may be achieved by the display apparatus 3A described above, which will not be described herein again.

The foregoing descriptions are merely some specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display apparatus, comprising a display panel, a light valve and front member(s), wherein the display panel comprises:
   a first display area, the first display area including first sub-pixels, and the first sub-pixels being non-transparent sub-pixels; and
   at least one second display area, the at least one second display area including second sub-pixels, and the second sub-pixels being transparent sub-pixels; wherein
   each of the second sub-pixels includes a second transmissive electrode layer, a second electroluminescent layer, and a third transmissive electrode layer that are disposed in a stack;
   at least one first sub-pixel includes a reflective electrode layer, a first electroluminescent layer, and a first transmissive electrode layer that are disposed in a stack; the reflective electrode layer is disposed closer to a back side of the display panel than the first electroluminescent layer, and is configured to reflect light emitted by the first electroluminescent layer;
   the light valve is disposed on the back side of the display panel, border(s) of orthographic projection(s) of the second display area(s) on the back side are located within a border of an orthographic projection of the light valve on the back side; the light valve is configured to allow or block light directed to the back side of the display panel to pass through the light valve;
   the front member(s) are disposed on a side of the light valve away from the display panel, and border(s) of orthographic projection(s) of the front member(s) on the back side are located within the border(s) of the orthographic projection(s) of the second display area(s) on the back side;
   the first display area is configured to display an image; and
   in a case where the light directed to the back side of the display panel does not pass through the second display area, the second display area is configured to display an image; and in a case where the light directed to the back side of the display panel passes through the second display area, the second display area is configured not to display an image.

2. The display apparatus according to claim 1, wherein the first electroluminescent layer is coupled to the second electroluminescent layer; or, the first electroluminescent layer is separated from the second electroluminescent layer.

3. The display apparatus according to claim 1, wherein the first transmissive electrode layer is coupled to the third transmissive electrode layer; or, the first transmissive electrode layer is separated from the third transmissive electrode layer.

4. The display apparatus according to claim 1, wherein an area of the first display area is greater than an area of the second display area(s).

5. The display apparatus according to claim 1, wherein the second display area(s) are disposed at an edge of the display panel; the second display area(s) are disposed around the first display area; or, the first display area is disposed around the second display area(s).

6. The display apparatus according to claim 1, wherein the light valve includes a first polarizer and a second polarizer with mutually perpendicular polarization directions, and a liquid crystal cell; the first polarizer and the second polarizer are disposed on two opposite surfaces of the liquid crystal cell; and
   the liquid crystal cell includes a liquid crystal layer, a first alignment film and a second alignment film that are disposed on opposite sides of the liquid crystal layer, and a first electrode and a second electrode that are used for driving liquid crystal molecules in the liquid crystal layer to rotate.

7. The display apparatus according to claim 6, wherein the first electrode is disposed between the first alignment film and the first polarizer, and the second electrode is disposed between the second alignment film and the second polarizer.

8. The display apparatus according to claim 1, wherein the front member(s) include at least one of a front camera unit or an infrared sensor unit.

9. The display apparatus according to claim 8, wherein the front member(s) include a front camera unit, and the front member(s) further include a front soft light lamp arranged side by side with the front camera unit.

10. The display apparatus according to claim 1, wherein the display apparatus further includes a first driving circuit configured to drive the display panel to display an image, and a second driving circuit configured to drive the light valve to control passage of light.

11. The display apparatus according to claim 10, wherein the display apparatus further comprises a printed circuit board, and the first driving circuit and the second driving circuit are both coupled to the printed circuit board.

12. A drive method for a display apparatus, wherein the display apparatus comprises a display panel, a light valve and front member(s); wherein the display panel comprises:
a first display area, the first display area including first sub-pixels, and the first sub-pixels being non-transparent sub-pixels; and
at least one second display area, the at least one second display area including second sub-pixels, and the second sub-pixels being transparent sub-pixels; wherein
each of the second sub-pixels includes a second transmissive electrode layer, a second electroluminescent layer, and a third transmissive electrode layer that are disposed in a stack;
at least one first sub-pixel includes a reflective electrode layer, a first electroluminescent layer, and a first transmissive electrode layer that are disposed in a stack; the reflective electrode layer is disposed closer to a back side of the display panel than the first electroluminescent layer, and is configured to reflect light emitted by the first electroluminescent layer;
the light valve is disposed on the back side of the display panel, border(s) of orthographic projection(s) of the second display area(s) on the back side are located within a border of an orthographic projection of the light valve on the back side; the light valve is configured to allow or block light directed to the back side of the display panel to pass through the light valve;
the front member(s) are disposed on a side of the light valve away from the display panel, and border(s) of orthographic projection(s) of the front member(s) on the back side are located within the border(s) of the orthographic projection(s) of the second display area(s) on the back side;
the first display area is configured to display an image; and
in a case where the light directed to the back side of the display panel does not pass through the second display area, the second display area is configured to display an image; and in a case where the light directed to the back side of the display panel passes through the second display area, the second display area is configured not to display an image;
the drive method for the display apparatus comprises:
driving the second display area(s) not to display an image and driving the light valve to be turned on in response to turning on the front member(s), so that the light directed to the back side of the display panel passes through the light valve; and
driving the second display area(s) to display an image and driving the light valve to be turned off in response to turning off the front member(s), so that the light directed to the back side of the display panel does not pass through the light valve.

13. The drive method for the display apparatus according to claim 12, wherein
the step of driving the second display area(s) not to display an image and driving the light valve to be turned on in response to turning on the front member(s), so that the light directed to the back side of the display panel passes through the light valve, includes:
acquiring an image to be displayed, driving the first display area to display the image to be displayed, stopping driving the second sub-pixels in the second display area(s), and driving the light valve to be turned on, so that the light directed to the back side of the display panel passes through the light valve; and
the step of driving the second display area(s) to display an image and driving the light valve to be turned off in response to turning off the front member(s), so that the light directed to the back side of the display panel does not pass through the light valve, includes:
acquiring an image to be displayed, driving the first display area to display a portion of the image to be displayed corresponding to the first display area, driving the second display area(s) to display portion(s) of the image to be displayed corresponding to the second display area(s), and driving the light valve to be turned off, so that the light directed to the back side of the display panel does not pass through the light valve.

14. The drive method according to claim 13, wherein the light valve includes the first polarizer and the second polarizer with mutually perpendicular polarization directions, and the liquid crystal cell; the liquid crystal cell includes the liquid crystal layer, the first alignment film and the second alignment film that are disposed on opposite sides of the liquid crystal layer, and the first electrode and the second electrode that are used for driving the liquid crystal molecules in the liquid crystal layer to rotate; the first electrode is disposed between the first alignment film and the first polarizer, and the second electrode is disposed between the second alignment film and the second polarizer;
the step of driving the light valve to be turned on includes: stopping inputting a voltage signal to the light valve for driving the liquid crystal molecules in the liquid crystal layer to rotate; and
the step of driving the light valve to be turned off includes: inputting a voltage signal to the light valve to form an electric field, so as to drive the liquid crystal molecules in the liquid crystal layer to rotate.

15. A display apparatus, comprising a display panel, a light valve and front member(s), wherein the display panel comprises:
a first display area, the first display area including first sub-pixels, and the first sub-pixels being non-transparent sub-pixels; and
at least one second display area, the at least one second display area including second sub-pixels, and the second sub-pixels being transparent sub-pixels; wherein each of the second sub-pixels includes a second transmissive electrode layer, a second electroluminescent layer, and a third transmissive electrode layer that are disposed in a stack;

each first sub-pixel includes a reflective layer, a first transmissive electrode layer, a first electroluminescent layer, and a fourth transmissive electrode layer that are disposed in a stack; the reflective layer is disposed closer to a back side of the display panel than the first transmissive electrode layer, and is configured to reflect light emitted by the first electroluminescent layer;

the light valve is disposed on the back side of the display panel, border(s) of orthographic projection(s) of the second display area(s) on the back side are located within a border of an orthographic projection of the light valve on the back side; the light valve is configured to allow or block light directed to the back side of the display panel to pass through the light valve;

the front member(s) are disposed on a side of the light valve away from the display panel, and border(s) of orthographic projection(s) of the front member(s) on the back side are located within the border(s) of the orthographic projection(s) of the second display area(s) on the back side;

the first display area is configured to display an image; and in a case where the light directed to the back side of the display panel does not pass through the second display area, the second display area is configured to display an image; and in a case where the light directed to the back side of the display panel passes through the second display area, the second display area is configured not to display an image.

* * * * *